United States Patent
Yoon et al.

(10) Patent No.: US 7,539,077 B2
(45) Date of Patent: May 26, 2009

(54) FLASH MEMORY DEVICE HAVING A DATA BUFFER AND PROGRAMMING METHOD OF THE SAME

(75) Inventors: Chi-Weon Yoon, Seoul (KR);
Heung-Soo Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/775,872

(22) Filed: Jul. 11, 2007

(65) Prior Publication Data
US 2008/0031050 A1 Feb. 7, 2008

(30) Foreign Application Priority Data
Aug. 3, 2006 (KR) .................. 10-2006-0073452

(51) Int. Cl.
*G11C 8/00* (2006.01)
(52) U.S. Cl. .................. 365/230.08; 365/230.09; 365/230.01; 365/230.03; 365/189.16; 365/189.05
(58) Field of Classification Search ............ 365/230.08, 365/230.09, 230.01, 230.03, 189.16, 189.05
See application file for complete search history.

(56) References Cited

U.S. PATENT DOCUMENTS

| | | | | |
|---|---|---|---|---|
| 3,840,863 A | * | 10/1974 | Fuqua et al. | 711/3 |
| 4,085,439 A | * | 4/1978 | Minnick | 710/72 |
| 4,745,407 A | * | 5/1988 | Costello | 345/550 |
| 4,833,657 A | * | 5/1989 | Tanaka | 365/230.04 |
| 6,014,225 A | * | 1/2000 | Tokito | 358/1.16 |
| 6,014,737 A | * | 1/2000 | Kurata | 712/219 |
| 6,076,137 A | * | 6/2000 | Asnaashari | 711/103 |
| 6,125,072 A | * | 9/2000 | Wu | 365/230.03 |
| 6,327,639 B1 | * | 12/2001 | Asnaashari | 711/103 |
| 6,370,073 B2 | * | 4/2002 | Leung | 365/222 |
| 6,567,313 B2 | | 5/2003 | Tanaka et al. | |
| 6,791,557 B2 | * | 9/2004 | Champion | 345/545 |
| 6,834,364 B2 | * | 12/2004 | Krech et al. | 714/45 |
| 6,868,519 B2 | * | 3/2005 | Beacken et al. | 714/762 |
| 6,906,964 B2 | * | 6/2005 | Spencer et al. | 365/189.05 |
| 6,937,524 B2 | | 8/2005 | Shiga et al. | |
| 6,992,674 B2 | * | 1/2006 | Champion et al. | 345/540 |
| 7,149,844 B2 | * | 12/2006 | Bernardi et al. | 711/103 |
| 2006/0056237 A1 | | 3/2006 | Jeong | |

FOREIGN PATENT DOCUMENTS

| | | |
|---|---|---|
| JP | 2001-014217 | 1/2001 |
| JP | 2002-109894 | 4/2002 |
| JP | 2004-022112 | 1/2004 |

(Continued)

*Primary Examiner*—Viet Q Nguyen
(74) *Attorney, Agent, or Firm*—Volentine & Whitt, P.L.L.C.

(57) ABSTRACT

A flash memory device includes a memory cell array with multiple memory cells, a data buffer, a write driver and a controller. The data buffer stores data to be programmed into the memory cells, the data having sequential data addresses. The write driver programs the data stored in the data buffer into the memory cells during one programming operation. The controller controls operations of the data buffer and the write driver, and performs flexible mapping between addresses of the data buffer and the data addresses based on a first address of the data.

16 Claims, 5 Drawing Sheets

FOREIGN PATENT DOCUMENTS

| | | |
|---|---|---|
| JP | 2006-085896 | 3/2006 |
| KR | 1020020026832 A | 4/2002 |
| KR | 1020050011869 A | 1/2005 |
| KR | 1020060024995 A | 3/2006 |
| WO | 94/20906 | 9/1994 |
| WO | 02/056600 A1 | 7/2002 |

* cited by examiner

A + B = 32 Word

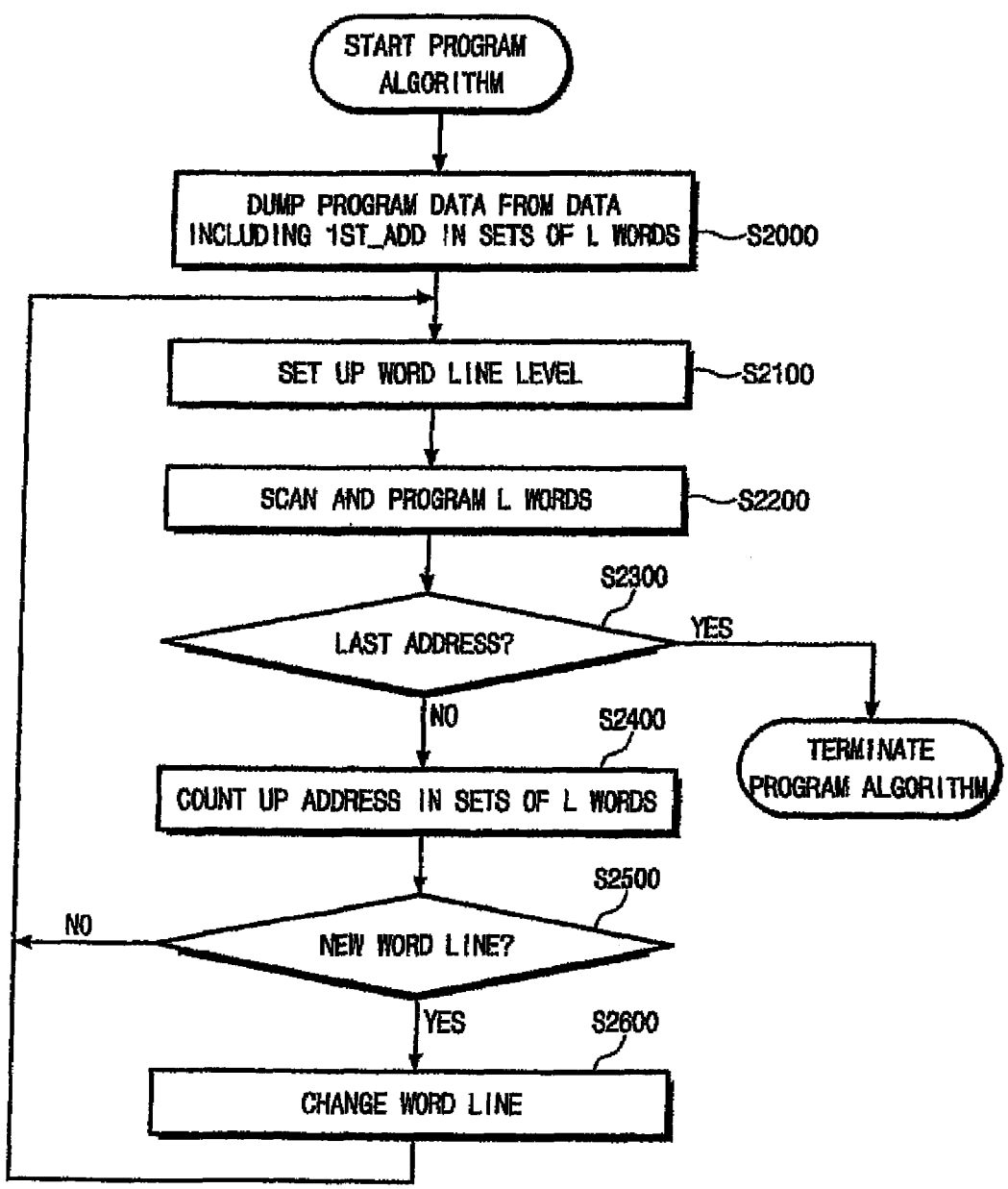

… … …

FLASH MEMORY DEVICE HAVING A DATA BUFFER AND PROGRAMMING METHOD OF THE SAME

CROSS-REFERENCE TO RELATED APPLICATIONS

A claim of priority is made to Korean Patent Application No. 10-2006-0073452, filed on Aug. 3, 2006, the subject matter of which is hereby incorporated by reference.

BACKGROUND OF THE INVENTION

1. Field of the Invention

The present invention relates to a flash memory device, and more particularly, to a flash memory device including a data buffer, and a programming method of the same.

2. Description of the Related Art

Semiconductor memory devices are classified as either volatile semiconductor memory devices or non-volatile semiconductor memory devices. Volatile semiconductor memory devices have high read and write operation speeds, but lose their data when power supply is stopped. Non-volatile semiconductor memory devices retain their data even without power. Therefore, non-volatile semiconductor memory devices are used to store data that must be preserved regardless of power supply. A flash memory, such as a flash electrically erasable programmable read-only memory (EEPROM), which is one type of nonvolatile semiconductor memory device, is particularly advantageous for use as a large-capacity secondary memory device because of its high degree of integration.

Flash memories are classified as either NAND type flash memories or NOR type flash memories. The NAND flash memories perform write operations (hereinafter, referred to as program or programming operations) and erase operations by Folwer-Nordheim tunneling (F-N tunneling). The NOR flash memories perform program operations by hot-electron injection, and erase operations by F-N tunneling. The NOR flash memories are code storage type memories, and are commonly used for devices that require high-speed data processing because of their high operation speeds.

A cell array of a NOR flash memory includes multiple banks, where each bank includes multiple sectors, and each sector includes multiple memory cells. In general, in the NOR flash memory, the erase operation is performed for each sector, and the program operation is performed for multiple words (or for each byte).

In response to demands for a low-cost and high-density flash memory, a multi-level cell (MLC) technology is being used instead of a single-level cell (SLC) technology. In the MLC technology, multiple bits of data, i.e., multiple states (e.g., 00, 10, 01, 00), can be stored in each memory cell, while in the SLC technology, a single bit of data, i.e., two states (e.g., 0, 1), can be stored in each memory cell.

In the MLC technology, one cell must be able to store multiple states. Since different programming is performed for each state of the MLC, precise programming control of each state is required. Consequently, an MLC flash memory requires more time for programming memory cells than an SLC flash memory. To address this problem, a buffer programming method may be used. In the buffer programming method, a data buffer receives and stores program data corresponding to N words (N is a positive integer), and performs a scan operation and a program operation on stored data.

In general, to perform a program operation in a flash memory, a corresponding address must be pre-erased (i.e., data must be made into 1 (or 11)). Thus, when program data is 1 (or 11), it can be assumed that the desired data has already been programmed even though no program operation has been performed. Thus, according to the buffer programming method, data 0 (or 00, 01, 10), which is to be actually programmed, is retrieved by scanning the data stored in the data buffer. The retrieved data are programmed simultaneously in sets of a predetermined number of bits.

FIG. 1 is a view showing an exemplary configuration of a data buffer storing data corresponding to N words.

Referring to FIG. 1, an address configuration of the data buffer is physically fixed, corresponding to an address configuration of data to be stored in the data buffer. For example, each column address of the data to be stored determines a word region of the data buffer where the data are stored. The data stored in the data buffer have respective sequential addresses. When an address of the first data (hereinafter, referred to as a first data address) of the data to be stored in the data buffer corresponds to the $10^{th}$ word region of the data buffer, for example, the data are stored sequentially from the $10^{th}$ word region of the data buffer to an $N^{th}$ word region of the data buffer.

FIG. 2 is a view illustrating a general data storage example of storing program data in an N-word data buffer. Specifically, in FIG. 2, program data are stored in a 32-word data buffer.

Referring to FIG. 2, even when the data to be programmed (program data PGM_DATA) are consecutive data and correspond to 32 words, all of the program data PGM_DATA are not simultaneously stored in the data buffer due to the address configuration. For example, when a first data address 1st_ADD of the consecutive program data PGM_DATA corresponds to a $21^{st}$ word region ADD 20 of the data buffer, the program data PGM_DATA are stored in the data buffer from the $21^{st}$ word region ADD 20 to a $32^{nd}$ word region ADD 31 (refer to part "A" of FIG. 2). Then, after the program data stored in the data buffer are programmed (e.g., written to a memory cell array), the remaining program data PGM_DATA are stored in the data buffer from a first word region ADD 0 to a $20^{th}$ word region ADD 19 (refer to part "B" of FIG. 2). Thus, even though the program data PGM_DATA have 32 words with consecutive addresses, the program data PGM_DATA are divided into two groups, part A and part B, and are separately stored because of a limited physical address boundary of the data buffer. Further, the two separate groups of data are then programmed independently, which increases a programming time.

SUMMARY OF THE INVENTION

An aspect of the present invention provides a flash memory device, including a memory cell array having multiple memory cells; a data buffer for storing data to be programmed into the memory cells, the data having sequential data addresses; and a write driver for programming the data stored in the data buffer into the memory cells during one programming operation. The flash memory also includes a controller for controlling operations of the data buffer and the write driver, and for performing flexible mapping between addresses of the data buffer and the sequential data addresses based on a first address of the data. The data buffer may store all of the data to be programmed into the memory cells during the one program operation. Also, the data buffer may include at least one buffer with a data storage capacity of N words. The total size of the data may be equal to or less than a data storage capacity of the data buffer.

The controller may store a first portion of the data in the data buffer sequentially from a data storage region corresponding to the first address of the data addresses to a last data storage region corresponding to a last data buffer address. The controller may then store a second portion of the data in the data buffer sequentially from a first data storage region corresponding a first data buffer address to a data storage region preceding the data storage region corresponding to the first address. The controller may perform the flexible mapping by mapping each address of the data addresses to an address of the data buffer corresponding to a value obtained by modulo operation of ADD mod N, where ADD is a data address and N is the number of words of data storable in the data buffer.

Another aspect of the present invention provides a method of programming a flash memory device having a data buffer. The method includes flexibly mapping sequential data addresses of program data to addresses of the data buffer based on a first data address of the sequential data addresses, and storing the program data in the data buffer according to the mapping. The program data stored in the data buffer are programmed into memory cells during one program operation.

Flexibly mapping the sequential data addresses to the data buffer addresses may include determining an address input range of the program data based on the first data address, and determining a location of the data buffer in which each of the program data within the address input range is to be loaded. Determining the location of the data buffer in which each of the program data is to be loaded may include determining a data buffer address corresponding to a value obtained by modulo operation of ADD mod N, where ADD denotes an address of each of the program data, and N is a number of words storable in the data buffer. Also, storing the program data in the data buffer according to the mapping may include storing a first portion of the program data sequentially from a data storage region corresponding to the first data address to a data storage region corresponding to a last data buffer address, and storing a second portion of the program data sequentially from a data storage region corresponding to a first data buffer address to a data storage region preceding the data storage region corresponding to the first data address.

Programming the data stored in the data buffer into the memory cells may include performing a data scanning operation on the program data stored in the data buffer in sets of L words to retrieve at least a portion of the program data, and programming the at least a portion of the program data retrieved by the data scanning operation in sets of predetermined bits. Also, programming the program data stored in the data buffer into the memory cells may include programming the stored program data stored in a data storage region corresponding to the first address to a data storage region corresponding to a last data buffer address, and programming the stored program data stored in a data storage region corresponding to a first data buffer address to a data storage region preceding the data storage region corresponding to the first data address.

BRIEF DESCRIPTION OF THE DRAWINGS

The embodiments of the present invention will be described with reference to the attached drawings, in which:

FIG. 6 is a flowchart illustrating a method of programming data, according to an exemplary embodiment of the present invention.

DETAILED DESCRIPTION OF THE EMBODIMENTS

Figure 1:
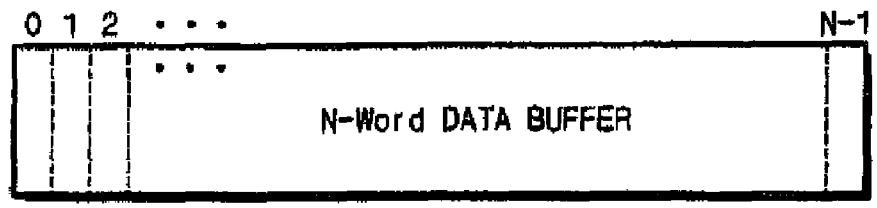
FIG. 1 illustrates a configuration of a data buffer that stores data corresponding to N words.
Figure 2:
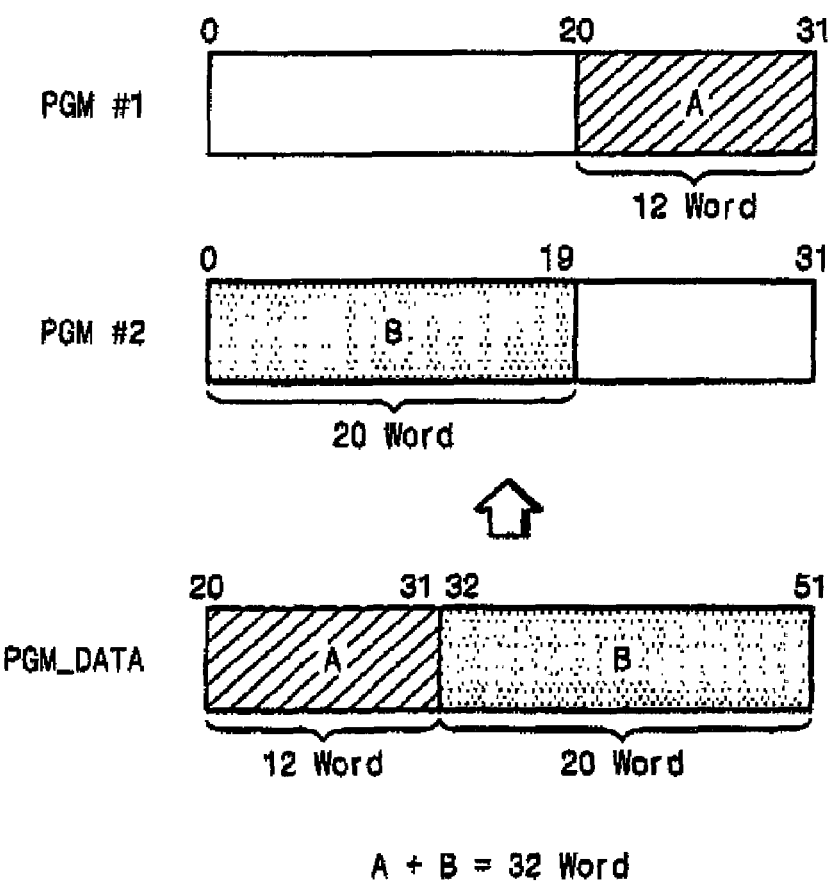
FIG. 2 illustrates a general data storage example of storing program data in an N-word data buffer.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Figure 3:
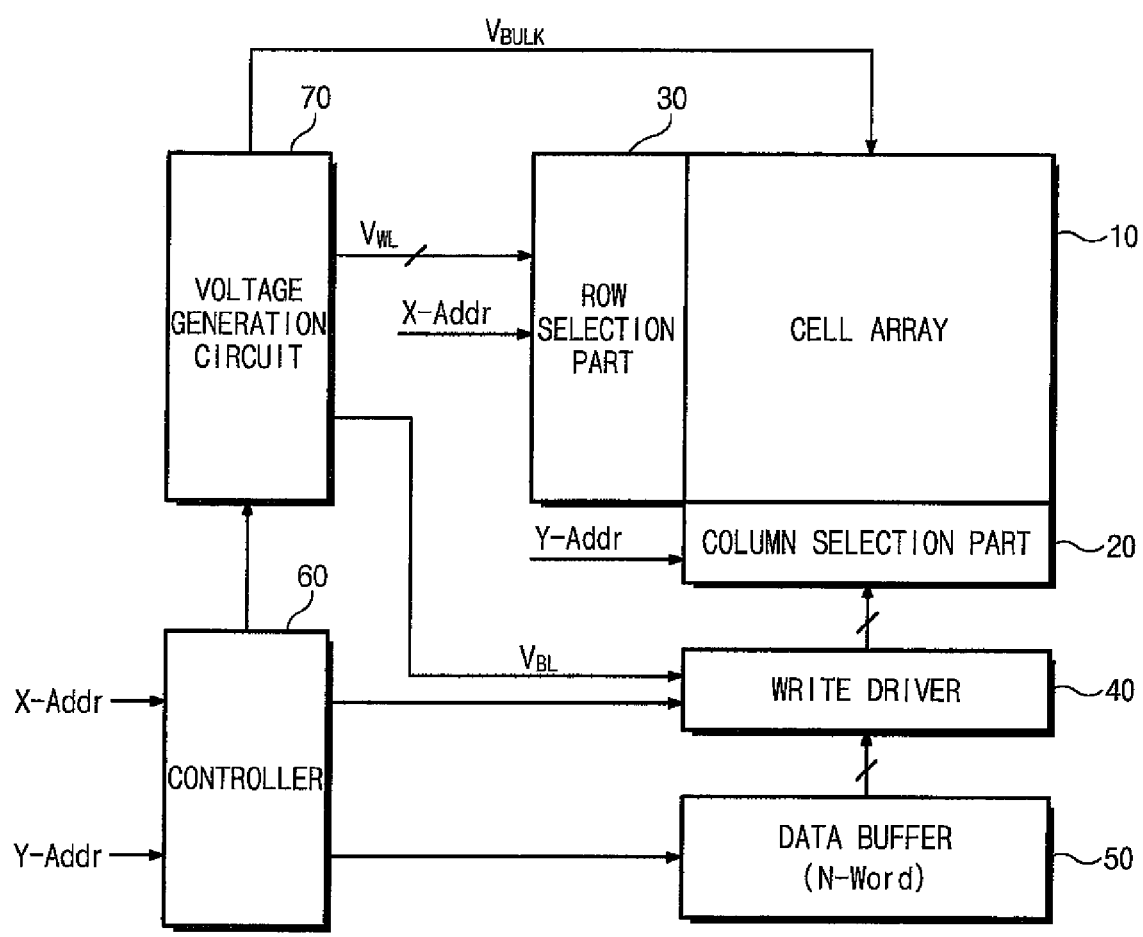
FIG. 3 is a block diagram illustrating an overall configuration of a flash memory device, according to an exemplary embodiment of the present invention.

FIG. 3 is a block diagram showing an overall configuration of a flash memory device 100, according to an exemplary embodiment of the present invention. In the depicted embodiment, the flash memory device 100 is a NOR flash memory device.

Referring to FIG. 3, the flash memory device 100 includes a memory cell array 10, a column selection unit 20, a row selection unit 30, a write driver 40, a data buffer 50, a controller 60 and a voltage generation circuit 70.

The memory cell array 10 includes multiple banks, each bank includes multiple sectors, and each sector includes multiple memory cells. The memory cells may be arranged at crossings of rows (i.e., word lines) and columns (i.e., bit lines).

The voltage generation circuit 70 generates constant voltages (e.g., bulk voltage $V_{BULK}$, word line voltage $V_{WL}$, and bit line voltage $V_{BL}$) required for program, erase and read operations of a memory cell. The row selection unit 30 selects one word line in response to a row address X-Addr, and applies a word line voltage $V_{WL}$ generated from the voltage generation circuit 70. The column selection unit 20 selects multiple bit lines in response to a column address Y-Addr.

The data buffer 50 is configured to have data storage capacity corresponding to N words (e.g., N×16 bits). The data buffer 50 previously stores N-word program data PGM_DATA, to be used during a single program operation. The program data PGM_DATA stored in the data buffer 50 are provided to the write driver 40.

The write driver 40 retrieves the data which are to be actually programmed from the data buffer 50 through a scanning operation, for example. The write driver 40 simultaneously programs the retrieved data in sets of a predetermined number of bits. A scan algorithm used in the write driver 40 may be configured in a variety of forms. For example, a new scanning operation may be performed while data acquired by previous scanning is programmed, or a data loading operation and a scanning operation from the data buffer 50 may be performed simultaneously. The scanning and program operations may be modified and changed variously, without departing from the spirit and scope of the present invention.

The controller 60 generates control signals for the write driver 40, the data buffer 50 and the voltage generation circuit 70 to control overall operations related to the program, erase and read operations of the flash memory. Particularly, the controller 60 stores the program data PGM_DATA flexibly into the data buffer 50, so as to prevent the data from being affected by physical address boundaries of the data buffer 50. The program data PGM_DATA stored in the data buffer 50 have sequential addresses. The total size of the program data PGM_DATA stored in the data buffer 50 is equal to or less than the total storage capacity of the data buffer 50.

Figure 4:
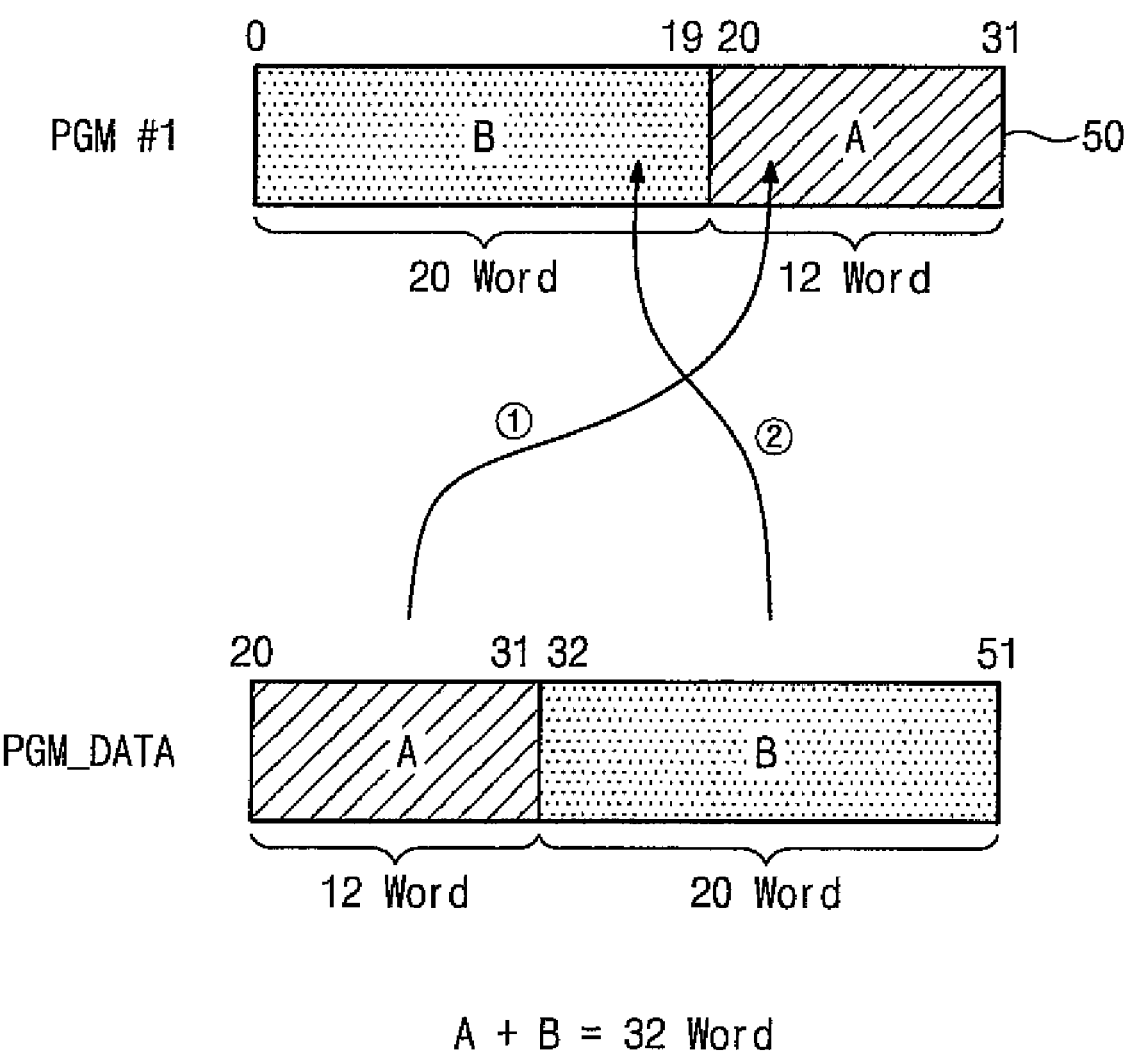
FIG. 4 illustrates an example of storing program data in an N-word data buffer, according to an exemplary embodiment of the present invention.

FIG. 4 illustrates an example of the program data PGM_DATA being stored in the N-word data buffer 50. More particularly, FIG. 4 illustrates a data storage method of storing 32-word data in the data buffer 50.

Referring to FIG. 4, even when an address configuration of the program data PGM_DATA falls outside a physical address boundary of the data buffer 50, all of the program data PGM_DATA can be stored in the data buffer 50. For example, a first data address 1st_ADD of the sequential addresses of the program data PGM_DATA may correspond to a $21^{st}$ word region of the data buffer 50 having an address ADD 20. Accordingly, the program data PGM_DATA are stored in the data buffer 50 sequentially from the $21^{st}$ word region having the address ADD 20 to a $32^{nd}$ word region having an address ADD 31 (shown as part "A" of FIG. 4), which corresponds to the last physical address of the data buffer 50. The remaining program data PGM_DATA are stored in the data buffer 50 sequentially from a first word region having an address ADD 0 to a $20^{th}$ word region having an address ADD 19 (shown as part "B" of FIG. 4). Thus, the first 12 words of the program data PGM_DATA are stored in ADD 20 through ADD 31 (part A) of the data buffer 50, and the remaining 20 words of the program data PGM_DATA are stored in ADD 0 through ADD 19 (part B) of the data buffer 50.

As stated above, the data storing is performed under the control of the controller 60. The controller 60 stores the first data address 1st_ADD and/or information relating to the first data address 1st_ADD of the sequential program data PGM_DATA, and performs address-mapping between the program data PGM_DATA and the data buffer 50 addresses, based on the stored first data address 1st_ADD or the related information. Therefore, all of the program data PGM_DATA is stored in the data buffer 50, without being affected by the physical address boundaries of the data buffer 50. Likewise, the program data PGM_DATA stored in the data buffer 50 may be programmed (e.g., written to the cell array 20) during a single program operation. The programming time is therefore significantly reduced as compared to the conventional art.

Address regions (particularly, the column addresses) of the data in part A and the data in part B of FIG. 4 do not overlap. Thus, storing the data in part A and the data in part B in one data buffer 50 causes no problems in programming. The row addresses of the data in part A and the data in part B may be the same as or different from each other. When the row addresses of the data in part A and the data in part B are different, word-line level setup is performed on the different word lines, and then the program operation is performed.

In an embodiment of the present invention, a data storage method of storing program data PGM_DATA in the data buffer 50, and a programming method using the program data PGM_DATA stored in the data buffer 50 will now be described.

Figure 5:
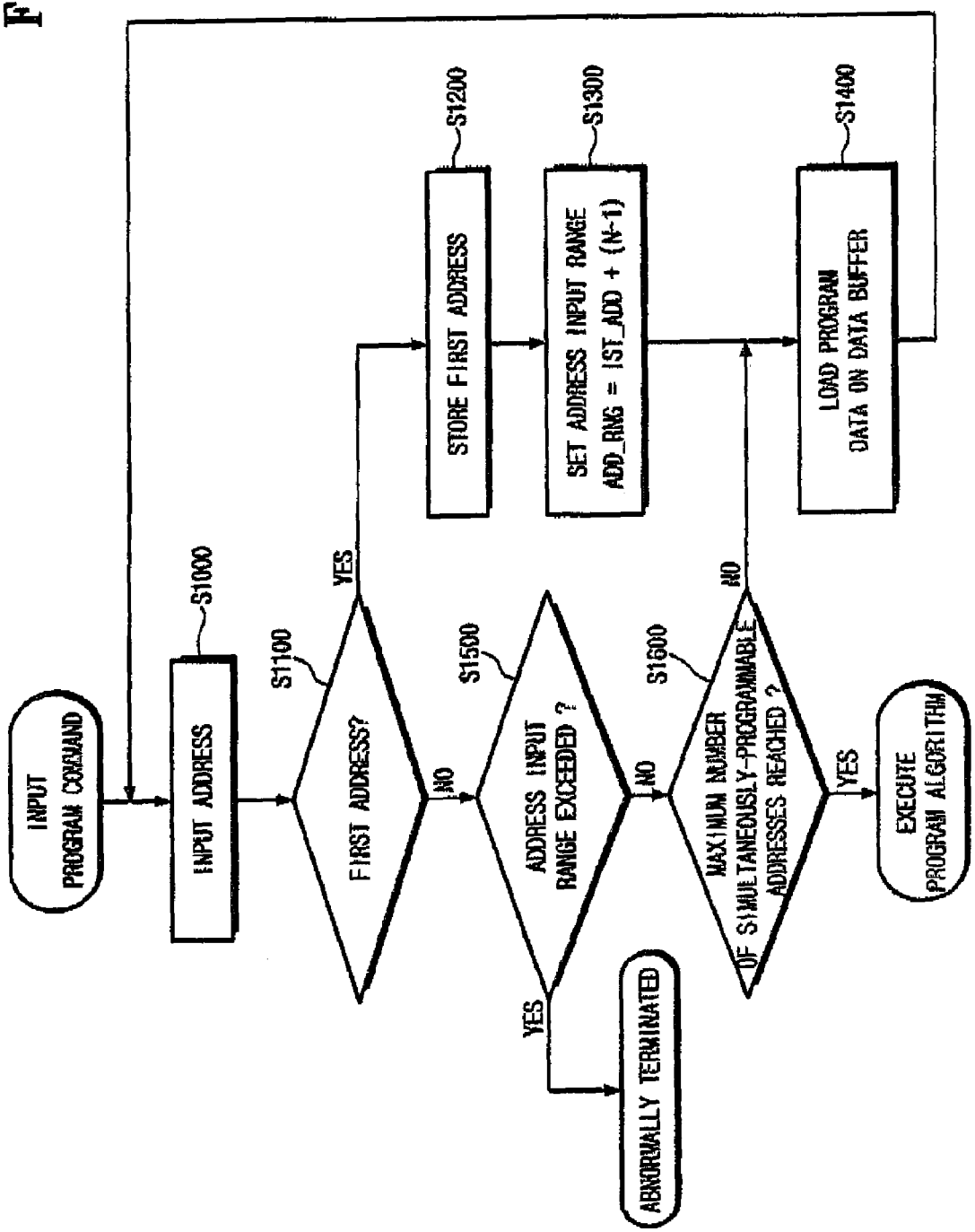
FIG. 5 is a flowchart illustrating a method of storing data in a data buffer, according to an exemplary embodiment of the present invention.

FIG. 5 is a flowchart showing a data storage method for storing program data PGM_DATA in the data buffer 50, according to an exemplary embodiment of the present invention.

Referring to FIGS. 3 and 5, when a program command is input, the controller 60 receives the address X-Addr and Y-Addr of data to be programmed (i.e., data of the program data PGM_DATA) in operation S1000. In operation S1100, the controller 60 determines whether the input address X-Addr and Y-Addr is a first data address 1st_ADD of the program data PGM_DATA.

When it is determined in operation S1100 that the address X-Addr and Y-Addr of the data is the first data address 1st_ADD of the program data PGM_DATA, indicating that the data is the 1st_DATA of the program data PGM_DATA, the first data address 1st_ADD is stored in the controller 60 in operation S1200. In operation 1300, the controller 60 determines an address input range ADD_RNG using the first data address 1st_ADD stored in operation S1200. The address input range ADD_RNG set in operation S1300 is determined by Equation 1 below:

$$ADD\_RNG = 1st\_ADD + (N-1) \quad \text{(Equation 1)}$$

In Equation 1, "1st_ADD" denotes the address of the first data 1st_DATA of the program data PGM_DATA, that is, the first data address 1st_ADD. Also, "N" denotes the number of words storable in the data buffer 50, and is a positive integer. The calculated address input range ADD_RNG therefore provides an address of an $N^{th}$ word data of the program data PGM_DATA, which is an address of the last word data stored in the data buffer 50. Referring to the example illustrated in FIG. 4, the ADD_RNG is the sum of 20 (1st_ADD) and 31 (N−1), which equals 51 (the address of the last word data).

In operation S1400, the data corresponding to the input first data address 1st_ADD is loaded and stored in the data buffer 50. Then, the operation returns to operation S1000, and the controller 60 receives a next sequential address.

When it is determined in operation S1100 that the input address X-Addr and Y-Addr is not the first data address 1st_ADD of the program data PGM_DATA, the controller 60 determines whether the address exceeds a previously determined address input range ADD_RNG, i.e., the last address, in operation S1500. When it is determined in operation S1500 that the input address exceeds the address input range ADD_RNG, the procedure is abnormally terminated. When it is determined in operation S1500 that the input address does not exceed the address input range ADD_RNG, the controller 60 determines in operation S1600 whether the input address reaches the maximum number (e.g., N words) of simultaneously programmable addresses.

When it is determined in operation S1600 that the input address has reached the maximum number of simultaneously programmable addresses, a program algorithm is performed. The program algorithm according to an embodiment of the present invention is described below with reference to FIG. 6.

When it is determined in operation S1600 that the input address has not reached the maximum number of simultaneously programmable addresses, operation S1400 is performed, so that the data corresponding to the input address is loaded and stored in the data buffer 50 at a data buffer address. The operation then returns to operation S1000. In operation S1400, a location DATA_LOC of the data buffer 50 where the program data will be loaded can be determined by Equation 2 below:

$$DATA\_LOC = ADD \bmod N \quad \text{(Equation 2)}$$

In Equation 2, "ADD" denotes an address of the input program data, and "N" denotes the number of words (e.g., 32) storable in the data buffer 50. In accordance with the modulo operation (expressed as "mod" in Equation 2), the first data 1st_DATA through the last data of the program data PGM_DATA can be mapped to and stored in corresponding locations in the data buffer 50, such that they do not overlap one another.

In accordance with Equation 2, once input program data are stored in the data buffer 50 from a location where the first data 1st_DATA is loaded to the $N^{th}$ location ADD N−1 (e.g., refer to part A of FIG. 4), the remaining input program data are stored from the first location ADD 0 of the data buffer 50 to a location preceding the location where the first input program data 1st_DATA was stored (e.g., refer to part B of FIG. 4). For example, referring to FIG. 4, the DATA_LOC of the last data of the program data PGM_DATA, which is ADD 51, is the modulo operation of 51 (ADD) and 32 (N), which is 19 (the address of the data buffer 50 in which the last data of the program data PGM-DATA is stored).

According to the loading method described above, when the program data PGM_DATA are data having consecutive N words, the program data PGM_DATA can be flexibly stored without being affected by the physical boundaries of the data buffer 50. To this end, the controller 60 stores a first address 1st_ADD of consecutive data of the program data PGM_DATA, and flexibly loads the program data PGM_DATA on the data buffer 50, using the stored first address 1st_ADD. The first address 1st_ADD of the program data PMG_DATA stored in the controller 60 is also used as a reference in a program operation. Therefore, the program data PGM_DATA flexibly stored in the data buffer 50 can be programmed into correct locations.

The above description, in which the program data PGM_DATA corresponding to N words are stored in the data buffer 50, is merely an example. Embodiments of the present invention may be applied in various forms even when the program data PGM_DATA corresponds to N words or less. Although a flash memory device including one data buffer of N words is described in the present invention, this is also merely an example of the present invention. Embodiments of the present invention may also be applied even where multiple N-word data buffers are provided.

FIG. 6 is a flowchart illustrating a programming method according to an exemplary embodiment of the present invention. In the example illustrated in FIG. 6, data stored in the N-word data buffer 50 are scanned and programmed in sets of L words (N≧L, where N and L are positive integers, respectively). As stated above, the programming method depicted in FIG. 6 is initiated, for example, when it is determined in operation S1600 of FIG. 5 that the input address has reached the maximum number of simultaneously programmable addresses.

Referring to FIG. 6, when a program algorithm is started, the flash memory device 100, according to an embodiment of the present invention, dumps the program data PGM_DATA, including a first word 1st_DATA, in sets of L words in operation S2000. By the data dumping operation S2000, the program data PGM_DATA stored in the data buffer 50 are loaded sequentially to the write driver 40 in sets of L words. For example, the data in part A of FIG. 4, starting with the first word 1st_DATA, are sequentially loaded on the write driver 40 in sets of L words. Then, the data in part B of FIG. 4 are loaded sequentially on the write driver 40 in sets of L words. To control the data dumping order, information of an address 1st_ADD of the first word 1st_DATA is stored in the controller 60.

After the data to be programmed are dumped in sets of L words in operation S2000, a level of a word line corresponding to an address PGM_ADD of the dumped data is set up in operation S2100. Then, a data scanning operation on the L words and a program operation of data retrieved by the scanning operation are performed in operation S2200. For example, the write driver 40 retrieves data 0's, i.e., data to be actually programmed among the data stored in the data buffer 50. Then, whenever the number of data 0's reaches the maximum number of simultaneously-programmable bits (e.g., 4 bits), the retrieved data 0's are programmed simultaneously. The scanning/program operations are performed in sets of L words. As is known to those skilled in the art, a high voltage supplied during a program operation of the flash memory device 100 may be generated through a charge pump provided within a chip. Thus, the number of bits that are simultaneously programmable is limited to 2 through 4, in general.

After the program operation is performed in operation S2200, it is determined whether an address of the programmed data is the last address of the program data PGM_DATA stored in the data buffer 50 in operation S2300. The last address means, for example, the last address ADD 51 of the program data PGM_DATA, illustrated in FIG. 4.

When it is determined in operation S2300 that the address of the data is the last address, the program algorithm is terminated. When it is determined in operation S2300 that the address of the data is not the last address, an address count-up operation is performed in sets of L words in operation S2400. The address count-up operation S2400 is performed through a counter (not shown) provided in the write driver 40.

In operation S2500, it is determined whether there is a new word line. When a new word line is detected in operation S2500, e.g., from the address of the data to be programmed, the word line is changed in operation 2600. Then, the process returns to operation S2100. When no new word line is detected from the address of the data to be programmed in operation S2500, the operation returns to operation S2100. In this manner, the program algorithm is repeated until the programming on the last address is terminated.

Although a buffer program method using the N-word data buffer 50 is described, this is merely an exemplary embodiment of the present invention. The size and configuration of the data buffer 50 applied to the program method may be modified, according to various embodiments of the present invention, without departing from the spirit and scope of the present invention. Likewise, various kinds of scan and program algorithms may be used.

The flash memory device and its program method, according to embodiments of the present invention, can flexibly store program data without being affected by a physical address boundary of a data buffer. Therefore, the total time and number of iterations of loading data on the data buffer and programming the data can be effectively reduced.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative. Thus, the scope of the present invention is to be determined by the broadest permissible interpretation of the following claims and their equivalents, and shall not be restricted or limited by the foregoing detailed description.

What is claimed is:

1. A flash memory device, comprising:
a memory cell array comprising a plurality of memory cells;
a data buffer for storing a plurality of data to be programmed into the memory cells, the plurality of data having a plurality of sequential data addresses;
a write driver for programming the plurality of data stored in the data buffer into the memory cells during one programming operation; and
a controller for controlling operations of the data buffer and the write driver,
wherein the controller performs flexible mapping between a plurality of addresses of the data buffer and the plurality of data addresses based on a first address of the data.

2. The flash memory device of claim 1, wherein the data buffer stores the plurality of data to be programmed into the memory cells during the one program operation.

3. The flash memory device of claim 1, wherein the data buffer comprises at least one buffer with a data storage capacity of N words.

4. The flash memory device of claim 1, wherein a size of the plurality of data is equal to or less than a data storage capacity of the data buffer.

5. The flash memory device of claim 1, wherein the controller stores a first portion of the plurality of data in the data buffer sequentially from a data storage region corresponding to the first address of the data addresses to a last data storage region corresponding to a last data buffer address, and stores a second portion of the plurality of data in the data buffer sequentially from a first data storage region corresponding a first data buffer address to a data storage region preceding the data storage region corresponding to the first address.

6. The flash memory device of claim 1, wherein the controller performs the flexible mapping by mapping each data address of the plurality of data addresses to a data buffer address corresponding to a value obtained by modulo operation of ADD mod N, wherein ADD comprises an address of the plurality of data addresses and N comprises a number of words of data storable in the data buffer.

7. A method of programming a flash memory device having a data buffer, the method comprising:
flexibly mapping sequential data addresses of a plurality of program data to addresses of the data buffer based on a first data address of the sequential data addresses;
storing the plurality of program data in the data buffer according to the mapping; and
programming the plurality of program data stored in the data buffer into memory cells,
wherein the plurality of program data stored in the data buffer are programmed into the memory cells during one program operation.

8. The method of claim 7, wherein the data buffer stores the plurality of data to be programmed into the memory cells during the one program operation.

9. The method of claim 7, wherein the data buffer comprises at least one buffer with data storage capacity of N words.

10. The method of claim 7, wherein a total size of the plurality of program data is equal to or less than a data storage capacity of the data buffer.

11. The method of claim 7, wherein flexibly mapping the sequential data addresses of the plurality of program data to the data buffer addresses comprises:

determining an address input range of the plurality of program data based on the first data address; and
determining a location of the data buffer in which each of the plurality of program data within the address input range is to be loaded.

12. The method of claim 11, wherein determining the location of the data buffer in which each of the plurality of program data is to be loaded comprises determining a data buffer address corresponding to a value obtained by modulo operation of ADD mod N, where ADD denotes an address of each of the plurality of program data, and N is a number of words storable in the data buffer.

13. The method of claim 7, wherein storing the plurality of program data in the data buffer according to the mapping comprises:
storing a first portion of the plurality of program data sequentially from a data storage region corresponding to the first data address to a data storage region corresponding to a last data buffer address of the data buffer; and
storing a second portion of the plurality of program data sequentially from a data storage region corresponding to a first data buffer address of the data buffer to a data storage region preceding the data storage region corresponding to the first data address.

14. The method of claim 7, wherein programming the data stored in the data buffer into the memory cells comprises:
performing a data scanning operation on the plurality of program data stored in the data buffer in sets of L words to retrieve at least a portion of the plurality of program data; and
programming the at least a portion of the plurality of program data retrieved by the data scanning operation in sets of predetermined bits.

15. The method of claim 7, wherein programming the plurality of program data stored in the data buffer into the memory cells comprises:
programming the stored program data stored in a data storage region corresponding to the first data address to a data storage region corresponding to a last data buffer address of the data buffer; and
programming the stored program data stored in a data storage region corresponding to a first data buffer address of the data buffer to a data storage region preceding the data storage region corresponding to the first data address.

16. A flash memory device, comprising:
a memory cell array comprising a plurality of memory cells;
a data buffer for storing a plurality of data to be programmed into the memory cells, the plurality of data having a plurality of sequential data addresses;
a write driver for programming the plurality of data stored in the data buffer into the memory cells during one programming operation; and
a controller for controlling operations of the data buffer and the write driver,
wherein the controller performs flexible mapping between a plurality of addresses of the data buffer and the plurality of data addresses included in at least one program data group based on a first address of the data within an address boundary of the data buffer.

* * * * *